United States Patent [19]

Sameshima

[11] Patent Number: 5,561,088
[45] Date of Patent: Oct. 1, 1996

[54] HEATING METHOD AND MANUFACTURING METHOD FOR SEMICONDUCTOR DEVICE

[75] Inventor: Toshiyuki Sameshima, Kanagawa, Japan

[73] Assignee: Sony Corporation, Tokyo, Japan

[21] Appl. No.: 380,812

[22] Filed: Jan. 30, 1995

[30] Foreign Application Priority Data

Feb. 10, 1994 [JP] Japan .................. 6-036290

[51] Int. Cl.$^6$ ........................... H01L 21/324
[52] U.S. Cl. .................. 437/247; 148/DIG. 3; 148/DIG. 6; 432/14; 437/105; 117/108
[58] Field of Search .................. 437/247, 248, 437/105; 432/6, 14, 5, 11, 152, 241, 253; 148/DIG. 3, DIG. 6; 117/108

[56] References Cited

U.S. PATENT DOCUMENTS

| | | | |
|---|---|---|---|
| 3,723,053 | 3/1973 | Myers et al. | 432/6 |
| 3,867,093 | 2/1975 | Muttermann | 432/6 |
| 4,018,184 | 4/1977 | Nagasawa et al. | 118/900 |
| 4,845,055 | 7/1989 | Ogata | 437/247 |
| 4,955,808 | 9/1990 | Miyagawa | 432/5 |
| 4,984,974 | 1/1991 | Naya et al. | 418/87 |
| 5,210,959 | 5/1993 | Brestovansky et al. | 432/11 |
| 5,296,412 | 3/1994 | Ohsawa | 437/247 |
| 5,313,075 | 5/1994 | Zhang et al. | 257/57 |
| 5,320,982 | 6/1994 | Tsubone et al. | 437/247 |
| 5,404,844 | 4/1995 | Schechter | 123/90.12 |
| 5,445,123 | 8/1995 | Hitomi et al. | 123/311 |

FOREIGN PATENT DOCUMENTS

| | | | |
|---|---|---|---|
| 3401524A | 7/1985 | Germany. | |
| 52-34440 | 3/1977 | Japan. | |
| 56-23748 | 3/1981 | Japan | 148/DIG. 93 |
| 1-22339 | 1/1989 | Japan. | |
| 2-50081 | 2/1990 | Japan | 432/11 |
| 4-164188 | 6/1992 | Japan. | |

OTHER PUBLICATIONS

Translation of DE 3401524 Jul. 1985.
Translation of JP 34440 Mar. 1977.
Translation of JP 64-22339 Jan. 1989.
Translation of JP4-164188 Jun. 1992.

*Primary Examiner*—Charles L. Bowers, Jr.
*Assistant Examiner*—Leon Radomsky
*Attorney, Agent, or Firm*—Hill, Steadman & Simpson

[57] ABSTRACT

In a heating method for semiconductor devices, gas is filled in a heat chamber in which a heat target (semiconductor device) is mounted, and then the gas is compressed to produce heat. The heat target is heated to a desired temperature by the produced heat. Before the gas compression is performed, the heat target is preferably pre-heated by a heater.

13 Claims, 10 Drawing Sheets

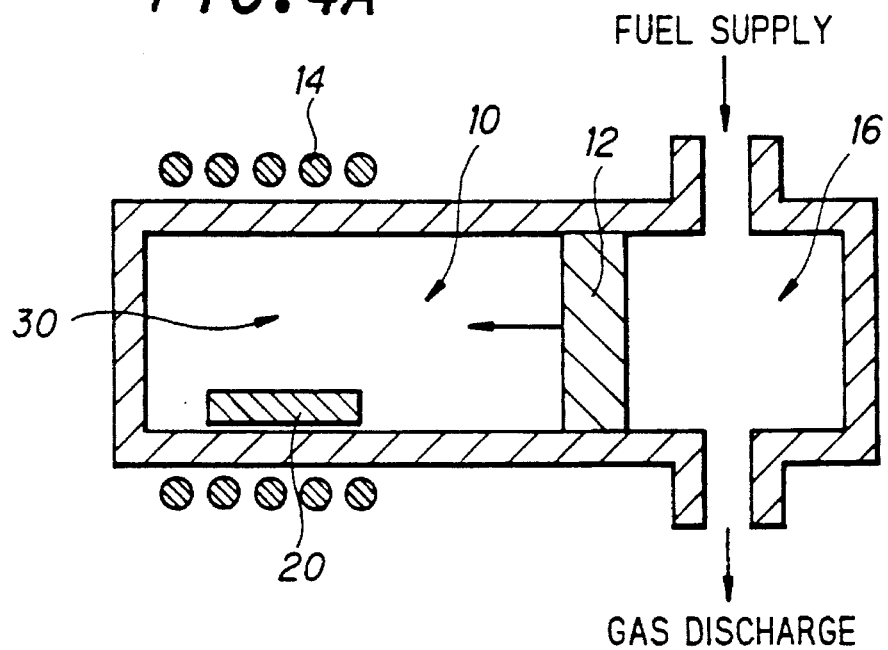
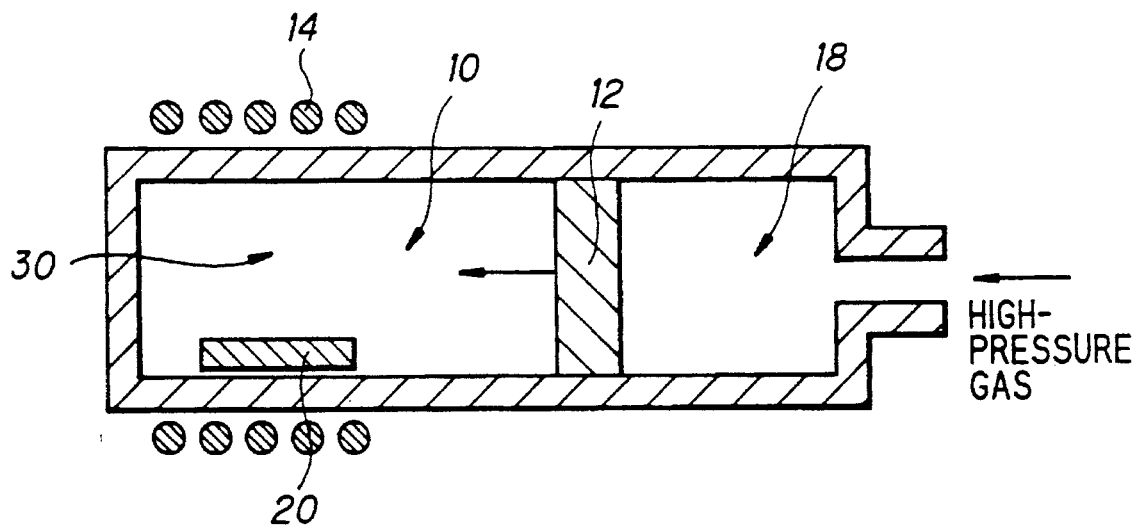

(HEAT TREATMENT)

(HEAT TREATMENT)

(ION IMPLANTATION)

(HEAT TREATMENT)

HEATING METHOD AND MANUFACTURING METHOD FOR SEMICONDUCTOR DEVICE

BACKGROUND OF THE INVENTION

1. Field of the Invention

The invention relates to a heating method using compression heat of gas and a manufacturing method for a semiconductor device. The heating method according to the present invention is most suitably applicable to a field which requires to heat an object to be heated (heat target) uniformly and in a short time.

2. Description of Related Art

A heating process has been indispensable for a manufacturing process for a semiconductor device to activate and crystallize an impurities-doped layer, form a thermally oxidized layer on the surface of a semiconductor substrate, etc. In such a heating process, a thermal treatment which is performed at a high temperature (about 1000° C.) and in a long time (30 minutes to one hour) using an electric furnace (hereinafter referred to as "furnace anneal method") has been usually and widely used. Furthermore, a short-time heating method using infrared radiation (hereinafter referred to as "rapid thermal anneal method") has been developed as a short-time heating method. In addition, a heating method using visible or ultraviolet pulse laser beam (hereinafter referred to as "pulse laser beam") has been studied as a shorter-time heating method. In this case, the thermal treatment can be performed in a shorter time (below one microsecond) by using a pulse beam having pulse width of 100 nanoseconds or less.

Recently, semiconductor devices have been improved to obtain a finer and higher-density structure, and this improvement in design of the semiconductor devices has increasingly required a technique of forming an extremely shallow (below 0.5 μm, for example) impurities-doped layer on a semiconductor substrate. However, in the conventional furnace anneal method, it has been difficult to control a diffusion condition of impurities. In order to overcome this disadvantage, the rapid thermal anneal method has been developed. In this method, the thermal treatment must be continued for about 10 seconds, and thus abnormal diffusion of impurities in a semiconductor substrate cannot be perfectly suppressed.

On the other hand, in the pulse laser beam method, the thermal treatment can be performed in one microsecond or less, and the diffusion of impurity atoms during the heating process can be extremely suppressed (below 0.1 μm, for example). However, this method has a disadvantage that the thermal treatment is ununiformly performed due to inhomogeneity in energy between pulse laser beams (fluctuation of the laser beam) or time variation of laser energy.

SUMMARY OF THE INVENTION

A first object of the present invention is to provide a heating method for heating a heat target uniformly and in an extremely short time.

A second object of the present invention is to provide a manufacturing method for a semiconductor device using the heating method.

The first object can be attained by a first heating method of filling gas into a heat chamber in which a heat target is mounted and then heating the heat target with heat which is produced by compressing the gas (heating gas).

In the first heating method, the heat target is preferably pre-heated before the gas is compressed.

The first object can be also attained by a second heating method of mounting a heat target in a heat-target holder, filling gas into a heat chamber which is not interconnected to the heat-target holder, and then heating the heat target with heat produced by compressing the gas.

In the second heating method, the heat target is preferably pre-heated before the gas is compressed.

The first object can be also attained by a third heating method in which a heat target of solid, powdery or liquid material is thermally treated by the second heating method to control vaporization of the heat target.

The second object can be attained by a first semiconductor device manufacturing method in which activation of an impurities-doped region on a substrate (heat target) or crystallization of an amorphous region or polycrystal region formed on the substrate is performed by the first heating method.

The second object can be also attained by a second semiconductor device manufacturing method in which oxygen-contained gas or oxygen and water contained gas are used as the heating gas, and a substrate (heat target) is thermally treated by the first heating method to form an oxide layer on the substrate with the compression heat of the gas.

The second object can be also attained by a third semiconductor device manufacturing method in which hydrogen or halogen contained gas is used, and a substrate (heat target) is thermally treated by the first heating method to reduce defects in the substrate.

The second object can be also attained by a fourth semiconductor device manufacturing method in which a semiconductor device comprising an amorphous silicon thin-film transistor is manufactured, and then the amorphous silicon thin-film transistor (heat target) is thermally treated by the first heating method.

In the heating method of the present invention, the gas is heated by rapidly compressing the gas filled in the heat chamber, and the heat target can be heated uniformly, at a high temperature and in a short time with the heat occurring in the compressed gas.

By applying the heating method of the present invention to the semiconductor device manufacturing method, the abnormal diffusion of the impurities due to the activation of the impurities-doped region formed on the substrate can be suppressed. In addition, the crystallization of the amorphous region or polycrystal region formed in the substrate can be performed uniformly and in a short time. Furthermore, a thin and uniform oxide film can be easily formed on the substrate, and the defects in the substrate can be surely reduced in a short time. In addition, the manufactured amorphous silicon thin-film transistor can be improved in characteristics without fluctuating or deteriorating the characteristics thereof. Furthermore, the vaporization of the heat target can be surely controlled by the third heating method of the present invention.

BRIEF DESCRIPTION OF THE DRAWINGS

FIGS. 4A and 4B are schematic diagrams showing another type of heating device to which the first heating method of the present invention is applied;

DETAILED DESCRIPTION OF THE PREFERRED EMBODIMENTS

Preferred embodiments according to the present invention will be described hereunder with reference to the accompanying drawings.

[Embodiment 1]

(First Heating Method)

Figure 1A:
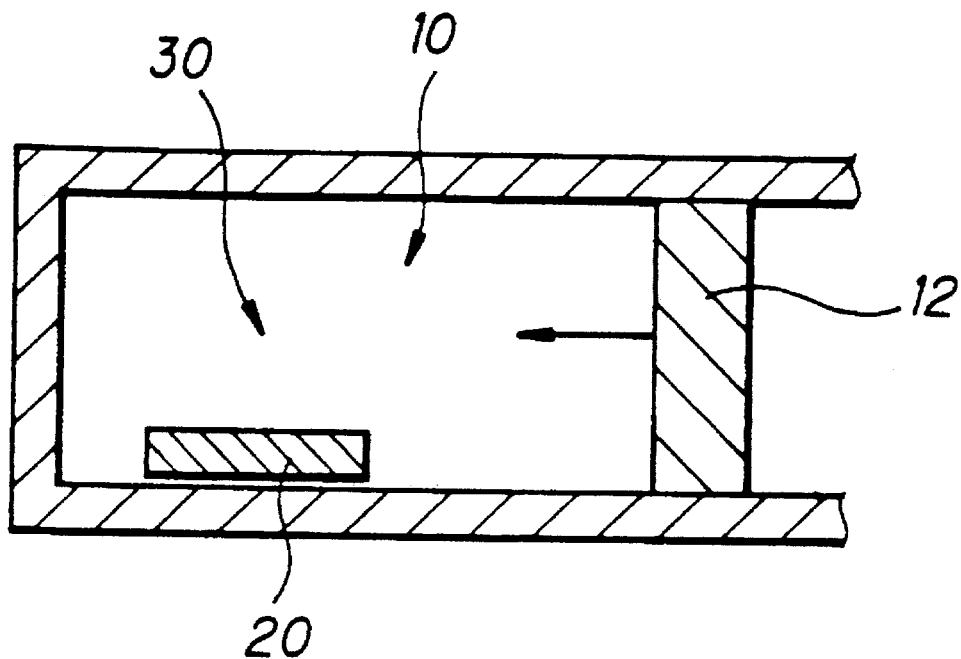
FIGS. 1A and 1B are diagrams showing a heating device to which a first heating method of the present invention is applied.

In a first heating method, after gas 30 Is filled in a heat chamber 10 in which an object to be heated (heat target) 20 is placed, the gas is compressed to generate heat and the heat target 20 is heated with the heat thus generated as shown in FIG. 1A. A heating device comprises the heat chamber 10 and a piston 12, and the gas 30 is filled in the heat chamber 10. In the heating device thus constructed, the gas 30 filled in the heat chamber 10 is adiabatically compressed by rapidly displacing the piston 12 in the left direction of FIG. 1A. At this time, the relationship between the temperature and pressure of the gas 30 is expressed as follows on the basis of the thermodynamics:

$$V^{r-1}T = Co$$

Here, V represents the volume of the gas, T represents the absolute temperature of the gas and Co represents a constant, and r is represented as follows:

$$r = Cp/Cv$$

Here, Cp represents specific heat at constant pressure, and Cv represents specific heat at constant volume. Accordingly, as the volume V of the gas is reduced, that is, as the gas is compressed, the temperature T of the gas increases.

Actually, the compression of the gas requires an finite time ($\Delta t$). Therefore, the heat which is generated during the compression of the gas is thermally conducted through the walls, etc. of the heat chamber 10 to the heat target 20 and then dissipated. Representing the thermal diffusivity of the heat target 20 by D, a distance (thermal diffusion length) at which the heat is diffused in the heat target for $\Delta t$ is approximately equal to $2\sqrt{(D\Delta t)}$. Accordingly, it is estimated in the system shown in FIG. 1A that the gas 30 in the heat chamber 30, a portion of the heat target 20 locating from the surface till the depth of $2\sqrt{(D\Delta t)}$ and the walls, etc. of the heat chamber 10 are adiabatically compressed and heated.

Now, it is assumed that the temperature of both of the gas 30 and the heat target 20 and the volume of the gas before the compression are represented by To and Vo respectively, and the gas is compressed for a time t, so that the temperature and the volume of the gas before the compression vary to T and V respectively. In the following description, it is assumed that the heat generated by the compression of the gas is rapidly conducted to the heat target 20 and the walls, etc. of the heat chamber 10, and thus the temperature of the gas in the heat chamber 10 is kept uniform. The temperature T at this time is provided according to the following equation. In this case, the gas is assumed to be compressed through compression steps of N (N is assumed to be sufficiently large), and thus the volume of the gas is assumed to be stepwisely varied from V0 to V at the N steps. The compressibility $\beta$ of the gas in a (1/N)-th compression step is set to $\beta$ ($=V_i/V_{i+1}$). Here, subscript i represents the i-th gas compression step. Furthermore, the gas compression is assumed to be performed in the same time in the (1/N)-th compression step.

$$T_i = \beta^{r-1} T_{i-1}$$

Here,
n: mole number of gas with which the heat target and the walls, etc. of the heat chamber are heated
$\rho$: density of gas
$\rho$sub: density of heat target
Csub: specific heat of heat target It is now considered that a glass substrate is used as the heat target. In this case, Csub is equal to 0.8 J/gK, and D is equal to 0.006 cm²/s. It is now assumed that the heat target 20 is heated in an adiabatic compression mode by a heating device on the condition that the pressure of the gas before the compression is set to 1 atm. and an amount of the gas which contributes to the healing is set to 100 cm³ per unit area (1 cm²) of the heat target 20. In this case, the gas exists in an amount of $4.464 \times 10^{-3}$ mole per unit area of the heat target.

The following is the relationship between the specific heat at constant pressure and r of main gases.

| GAS | SPECIFIC HEAT AT CONSTANT PRESSURE | r |
|---|---|---|
| argon | 0.523 | 1.67 |
| air | 0.1 | 1.40 |
| oxygen | 0.92 | 1.39 |
| nitrogen | 1.04 | 1.40 |
| hydrogen | 14.2 | 1.40 |

Figure 2A:
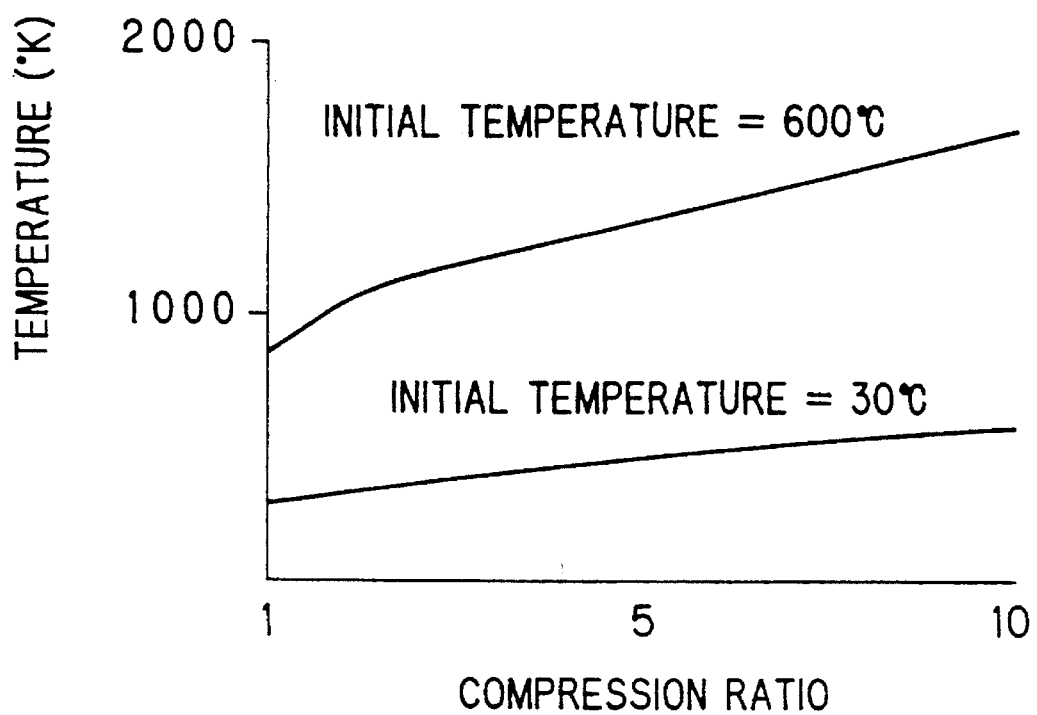
FIGS. 2A and 2B are graphs showing the relationship between each of the compression rate and the compression time of gas and temperature increase.

On the basis of the equation (1) are calculated the temperature increase and volume compression ratio (Vo/V) of the heat target 20 after the gas 30 in the heat chamber 10 is compressed for 10 milliseconds under the condition that nitrogen is used as the gas, and the temperature of the heat target 20 and the temperature of the gas before the compression (To$_0$, hereinafter referred to as "initial temperature") are set to a room temperature (30° C.) and 600° C., respectively. The result is shown in FIG. 2A. As is apparent from FIG. 2A, the temperature increase of the heat target becomes greater as the volume compression ratio increases.

Furthermore, the maximum temperature which the heat target 20 after heated reaches becomes higher as the initial temperature (To) increases. When the initial temperature (To) is set to 600° C., the temperature of the heat target increases to 1000° C. or more for the volume compression ratio of 5 or more.

Figure 2B:
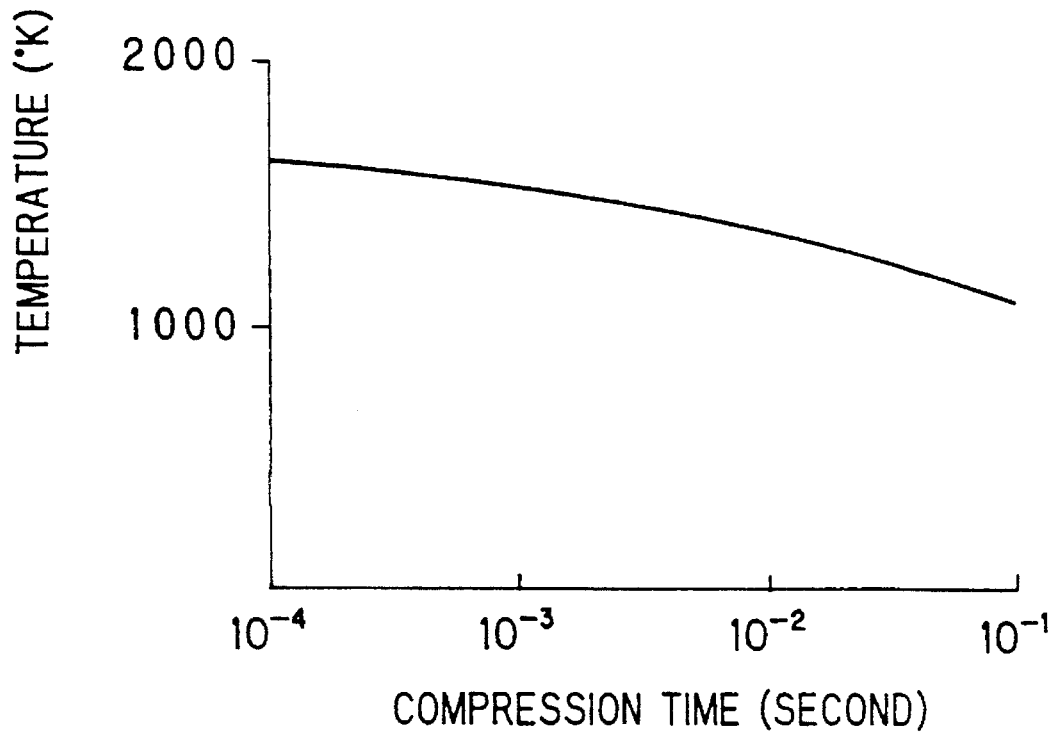

The relationship between the temperature increase of the heat target and the compression time of the gas (the time from the gas-compression start till the gas-compression end) when nitrogen is used as the gas and the initial temperature and the volume compression ration are set to 600° C. and 5 respectively. The result is shown in FIG. 2B. As is apparent from FIG. 2B, since the shorter the compression time of the gas is, the smaller the thermal diffusion length is, the temperature increase of the heat target 20 becomes greater.

As shown in FIGS. 2A and 2B, by controlling the initial temperature, the gas compression ratio and the gas compression time according to the heating method of the present invention, the temperature increase of the heat target can be surely controlled. In addition, the temperature increase of the heat target can be performed in an extremely short time.

Figure 1B:
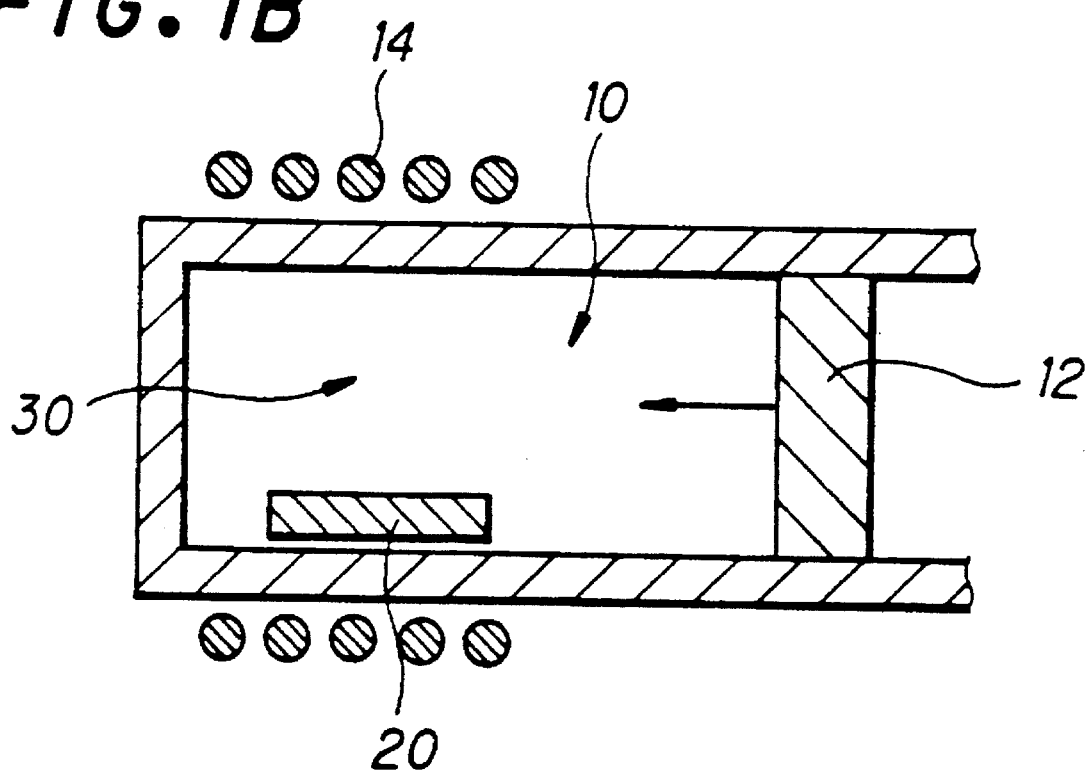
Figure 3A:
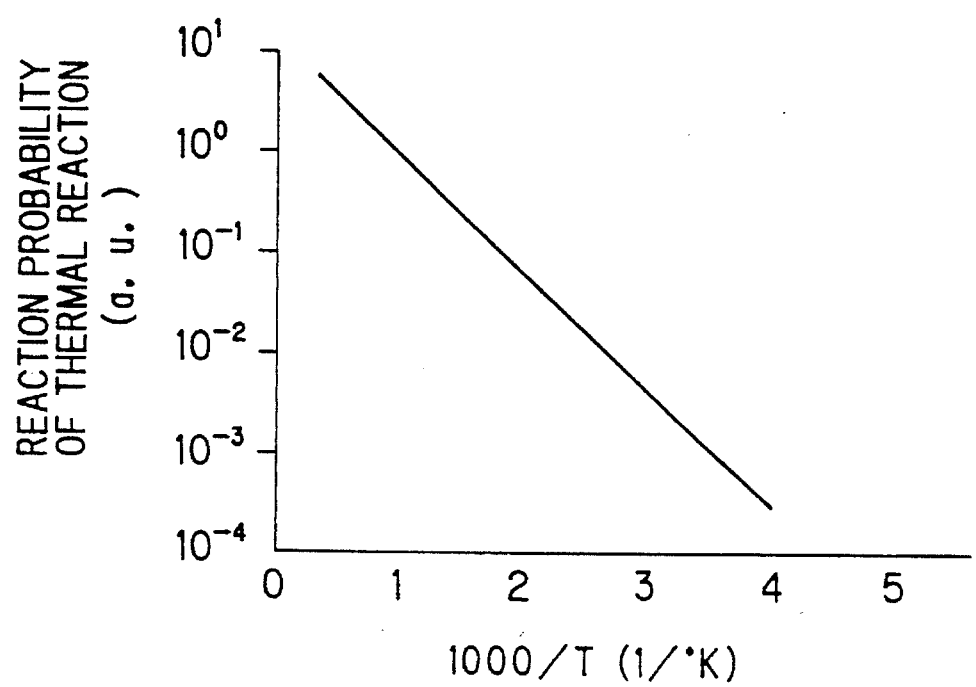
FIGS. 3A and 3B are graphs schematically showing the reaction probability of a thermal reaction and a cooling state of a heat target.

In the heating method of the present invention, it is effective to pre-heat the heat target before the gas is compressed. The reaction probability of many thermal reactions such as crystallization, activation of impurities, oxidation, dissolution of gas, etc. is greatly dependent on the temperature shown in FIG. 3A. Accordingly, if the heat target 20 is pre-heated with a heater disposed at the outside of the heat chamber 10 as shown in FIG. 1B under such a condition that no thermal reaction occurs in the heat target 20 (or the thermal reaction is negligibly small even if it occurs) and then the heating method of the present invention is executed, the thermal treatment can be performed efficiently and in a short time as shown in FIG. 2 with no great driving force for compressing the gas, in other words, without compressing the gas in a large volume compression ratio.

Figure 3B:
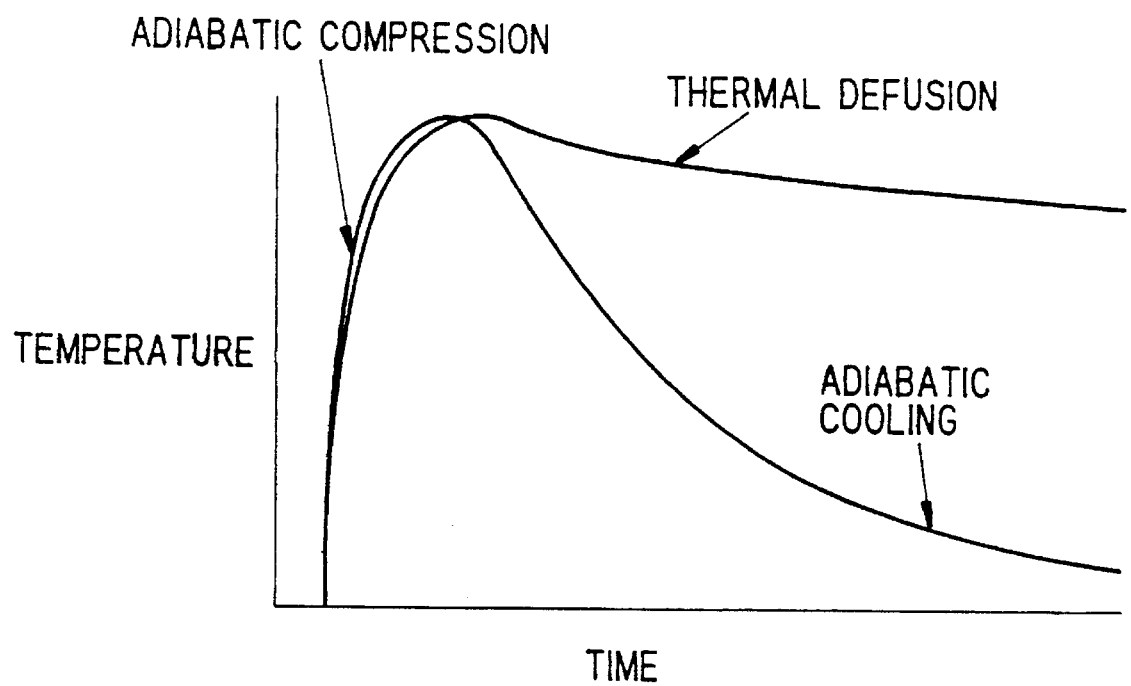

The heat target 20 is gradually cooled due to thermal diffusion after its temperature reaches the peak temperature. If the gas is compressed at maximum and then the volume of the heat chamber 10 is increased, that is, the piston 12 is displaced to the right in FIG. 1, the gas in the heat chamber 10 is rapidly expanded and it is adiabatically cooled. With this process, the heat target can be rapidly and easily cooled as shown in FIG. 3B. Accordingly, according to the heating method of the present invention, the short-time and uniform heating process and the rapid cooling process can be performed for the heat target.

In order to actuate the piston 12 for compressing the gas in the heat chamber 10, an internal combustion engine as shown in FIG. 4A may be applied. That is, a combustion chamber 16 is provided to the heating device so as to be adjacent to the heat chamber 10, and the combustion chamber 16 and the heat chamber 10 are partitioned by the piston 12. Fuel such as gasoline or the like is combusted (exploded) in the combustion chamber 16, and the piston 12 is rapidly displaced to the left by the expansion of the gas as shown in FIG. 4A. With this process, the gas in the heat chamber 10 can be rapidly compressed. In this case, the temperature in the heat chamber 10 is increased up to 2000° C. or more, and the pressure in the combustion chamber 16 increases to 6 atm. or more if the initial pressure is assumed to be 1 atm. As the fuel may be used gas containing hydrogen and oxygen or gas containing acetylene and oxygen.

Alternately, in order to actuate the piston 12 for compressing the gas in the heat chamber 10, a gas introducing chamber 18 may be provided as shown in FIG. 4B. In this case, for example, high-pressure gas of about 100 to 200 kg/cm² is introduced intermittently (in a pulse form). With this process, the piston 12 can be rapidly displaced to the left in FIG. 4B, so that the gas in the heat chamber 10 can be rapidly compressed.

[Embodiment 2]

(Second Heating Method)

In the second heating method, the heat target 20 is disposed in a heat-target holder 40, gas 30 is filed in a heat chamber 42 which does not intercommunicate with the heat-target holder 40, and then the gas 30 is compressed to generate heat, so that the heat target 20 is heated with the generated heat. The heat device comprises the heat-target holder 40, the heat chamber 42 and the piston 12, The heat chamber 42 is filled with the gas 30. By rapidly displacing the piston 12 to the left in FIG. 5A, the gas 30 filled in the heat chamber 42 is adiabatically compressed to generate heat. The heat target 20 disposed in the heat-target holder 40 is heated with the generated heat. It is preferable that a heater 14 is disposed at the outside of the heat chamber 42 as shown in FIG. 5B to pre-heat the heat target 20 before compressing the gas 30. The same mechanism as shown in FIG. 4A or FIG. 4B may be used as a displacing mechanism for the piston 12.

Next, a field effect transistor manufacturing method, a bipolar transistor manufacturing method and a thin-film transistor manufacturing method to which the heating method of the present invention is applied will be described.

[Embodiment 3]

(First and Second Semiconductor Device Manufacturing Methods: Field Effect Transistor Manufacturing Method)

The embodiment 3 relates to a field effect transistor (FET) manufacturing method in which the first heating method of the present invention is applied to formation of an oxide film on the surface of a semiconductor substrate and activation of an impurities-contained region (impurities-doped layer) formed in the semiconductor substrate. With respect to the formation of the oxide film, gas containing oxygen or steam is used as heating gas, and the first heating method is applied. With respect to the activation of the impurities-contained region, inert gas (Ar, for example) is used as the heating gas, and the first heating method of the present invention is applied. The FET manufacturing method of the embodiment 3 will be described hereunder with reference to FIG. 6.

First, a silicon semiconductor substrate 50 (corresponding to the substrate, and thus the heat target 20) on which an element separation region 51 is formed by a conventional method (for example, LOCOS method) is mounted in the heat-target holder (not shown) of the heat chamber 10, and gas (for example, nitrogen gas containing oxygen and steam, nitrogen gas containing oxygen, nitrogen gas containing steam or the like) is filled in the heat chamber 10. Thereafter, in a subsequent process, the semiconductor substrate 50 serving as the heat target is heated to 1000° C. or more by a heater 14, and then kept at about 600° C. No oxide film is formed on the surface of the semiconductor substrate 50 at this temperature.

Figure 7:
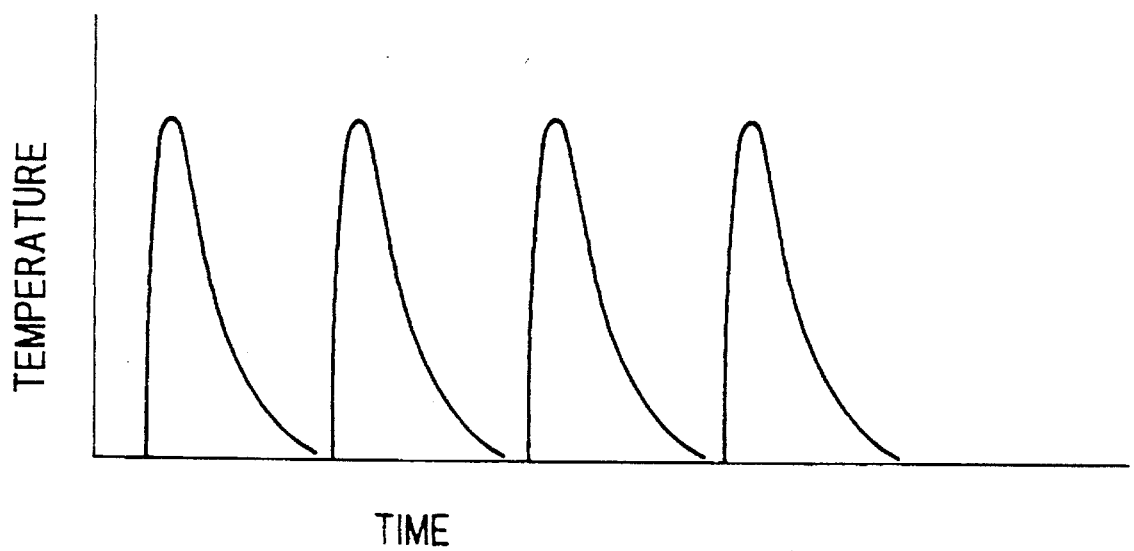
FIG. 7 is a graph showing a heat state of a heat target by compressing gas several times.

Next, the first heating method of the present invention is executed. That is, the piston 12 is rapidly displaced to the left in FIG. 1B to compress the gas 30 filled in the heat chamber 10, so that the semiconductor substrate 50 serving as the heat target is heated with the heat produced in the compressed gas. A heating condition is set so that the temperature of the semiconductor substrate 50 increases to 1000° C. or more. Through this process, the surface of the semiconductor substrate 50 is oxidized by $H_2O$ and oxygen existing in the gas. As a result, an extremely thin and uniform gate oxide film 52 is formed on the surface of the semiconductor substrate 50 (see FIG. 6A). The gate oxide film 52 can be formed at a lower heating temperature and in a shorter time than in the prior art, so that the gate oxide film is uniform and extremely thin. The frequency of the heating process for the heat target using the compression of the gas is not limited to one, and it can be suitably set to any frequency in accordance with the desired thickness of the gate oxide film 52. Therefore, the optimum heat oxidation can be performed by repeating the gas compression process at plural times as shown in FIG. 7.

Figure 6A:
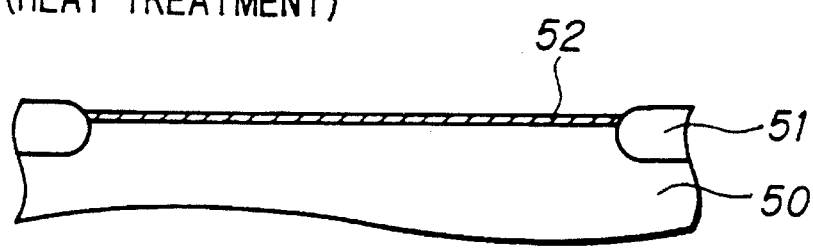
FIGS. 6A to 6D are partially cross-sectional views of a semiconductor substrate, etc. to explain a semiconductor device manufacturing method of a third embodiment according to the present invention.
Figure 6B:
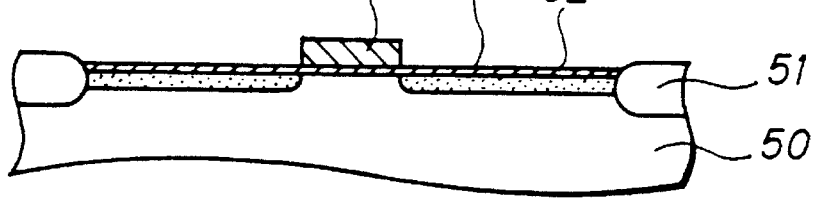
Figure 6C:
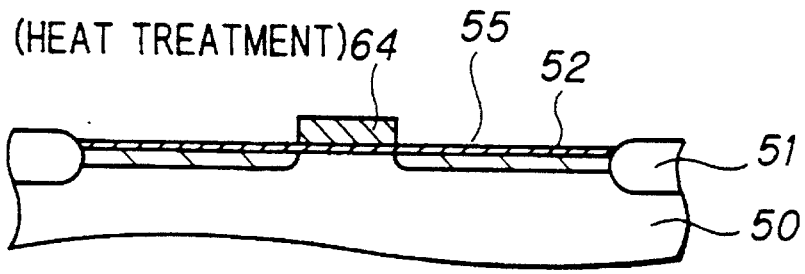
Figure 6D:
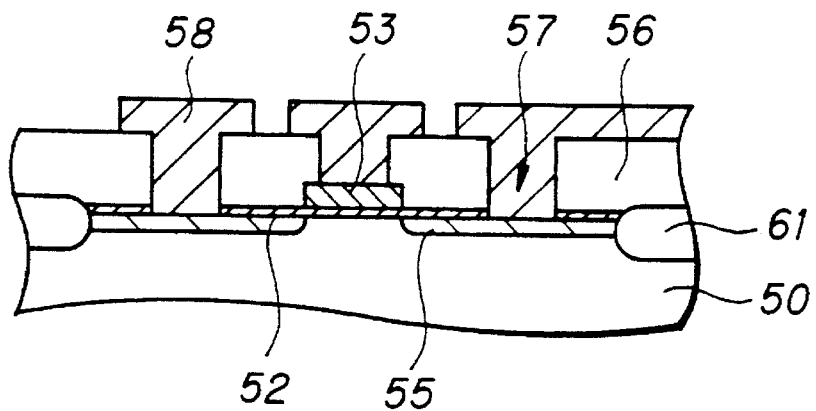

Thereafter, the semiconductor substrate 50 is taken out from the heating device to form a gate electrode 53 of polysilicon or the like on the substrate and then dope desired impurities into the semiconductor substrate 50 by the ion implantation method, thereby forming an impurities-contained region (impurities-doped layer) 54 (see FIG. 6B). In general, when impurity ions having high energy are doped, the semiconductor substrate 50 in the impurities-contained region 54 is deteriorated in crystallinity and thus it becomes amorphous. In addition, the doped impurities are in an inactive state.

Accordingly, the impurities-contained region 54 is activated by the first heating method of the present invention. In order to perform the activation on the impurities-contained region 54, the semiconductor substrate 50 (corresponding to the substrate, and thus the heat target 20) in which the impurities-contained region 54 is formed is mounted in the heat-target holder in the heat chamber 10 again, and gas (for example, inert gas such as Ar) is filled in the heat chamber 10. It has been generally known that the impurities doped by the ion-implantation method are not rapidly activated at about 600° C. in a short time, however, it would be rapidly activated if the temperature is increased to 1000° C. or more. Accordingly, in a subsequent heating process, the semiconductor substrate 50 serving as the heat target is heated to 1000° C. or more by the heater 14, and then it is kept at about 600° C.

Thereafter, the piston 12 is rapidly displaced to the left in FIG. 1B. Through this process, the gas filled in the heating chamber 10 is compressed, and the semiconductor substrate 50 (heat target) is directly heated with the heat produced by the compressed gas. The heat condition is set so that the temperature of the semiconductor substrate 50 is increased to 1000° C. or more. Through this process, the impurities-contained region 54 formed in the semiconductor substrate 50 is activated, and a source/drain region 55 is formed (see FIG. 6C). A heating time is set in a millisecond order. The heating time is still shorter than that in the short-time heating method using the infrared radiation, so that the diffusion of the impurities during the heating process can be sufficiently suppressed and a shallow source/drain region 55 can be formed. The frequency of the gas compression process is not limited to once, and it may be suitably adjusted to any frequency in accordance with the degree of activation. The heat activation can be optimized by executing the gas compression at plural times.

Thereafter, the semiconductor substrate 50 is taken out from the heating device, and an insulation layer 56 is formed on the source/drain region 55 and the gate electrode 53 which are formed on the semiconductor substrate 50, and then opening portions 57 are formed in the insulation layer 56. Subsequently, metal wiring material 58 is buried in the opening portions 57 (see FIG. 6D) to complete a field effect transistor.

[Embodiment 4]

(First Semiconductor Manufacturing Method: Bipolar Transistor Manufacturing Method)

The embodiment 4 relates to a bipolar transistor manufacturing method in which the first heating method of the present invention is applied to activation of the impurities-contained area (impurities-doped layer). In this embodiment, Inert gas such as Ar is used as the heating gas, and the first heating method of the present invention is performed. The semiconductor device (bipolar transistor) manufacturing method of the embodiment 4 will be described hereunder with reference to FIG. 8.

Figure 8A:
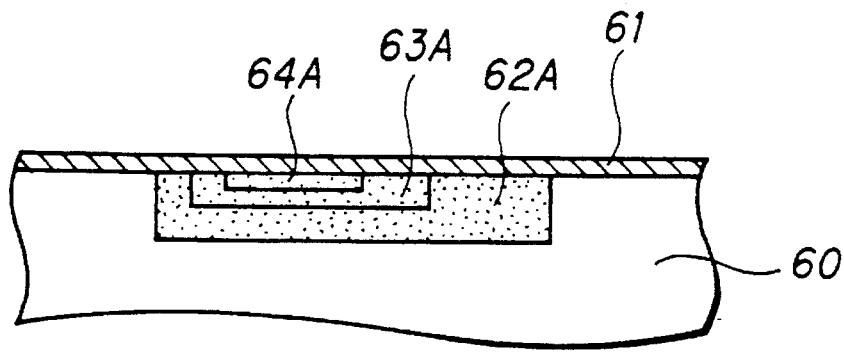
FIGS. 8A to 8C are partially cross-sectional views of a semiconductor substrate, etc. to explain a semiconductor device manufacturing method of a fourth embodiment of the present invention.
Figure 8B:
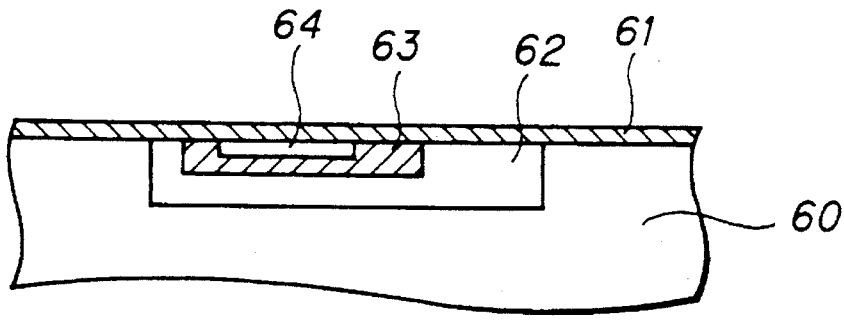
Figure 8C:
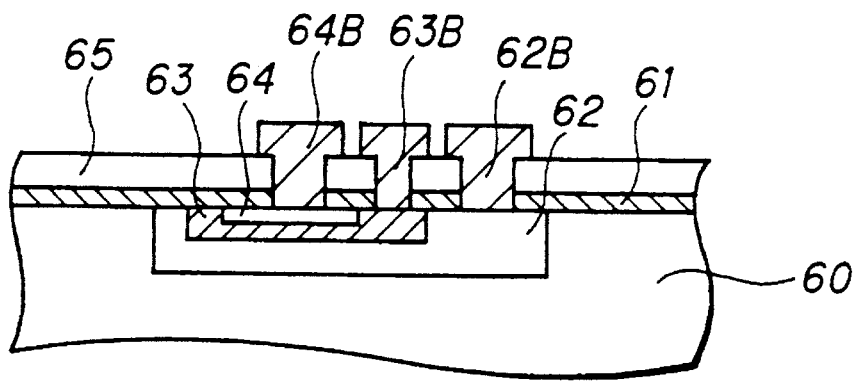

First, a protection film 61 is formed on a semiconductor substrate 60, and then desired impurities are doped into a collector-forming region 62A (on which a collector is to be formed) of the semiconductor substrate 60 by the ion implantation method. Furthermore, desired impurities are successively doped into a base-forming region 63A (on which a base is to be formed) and an emitter-forming region 64a (on which an emitter is to be formed) by the ion implantation method. Through this process, impurities-contained regions 62A, 63A and 64A re formed as shown in FIG. 8A.

Subsequently, the impurities-contained regions 62A, 63A and 64A are activated by the first heating method of the present invention. In order to perform this activation, the semiconductor substrate 60 (corresponding to the substrate, and thus the heat target 20) is mounted in the heat-target holder in the heat chamber 10, and the gas 30 of Ar is filled in the heat chamber 10. It has been generally known that the impurities doped by the ion-implantation method are not rapidly activated at about 600° C. in a short time, however, it would be rapidly activated if the temperature is increased to 1000° C. or more. Accordingly, in a subsequent heating process, the semiconductor substrate 60 serving as the heat target is heated to 1000° C. or more by the heater 14, and then it is kept at about 600° C.

Thereafter, the piston 12 is rapidly displaced to the left in FIG. 1B. Through this process, the gas filled in the heating chamber 10 is compressed, and the semiconductor substrate 60 (heat target) is directly heated with the heat produced by the compressed gas. The heat condition is set so that the temperature of the semiconductor substrate 60 is increased to 1000° C. or more. Through this process, the impurities-contained regions 62A, 63A and 64A formed in the semiconductor substrate 60 are activated, and a collector region 62, a base region 63 and an emitter region are formed (see FIG. 8B). A heating time is set in a millisecond order. The heating time is still shorter than that in the short-time heating method using the infrared radiation, so that the diffusion of the impurities during the heating process can be sufficiently suppressed, and a shallow emitter region 64 and a narrow base region can be formed. The frequency of the gas compression process is not limited to once, and it may be suitably adjusted to any frequency in accordance with the degree of activation. The heat activation can be optimized by executing the gas compression at plural times.

Thereafter, the semiconductor substrate 60 is taken out from the heating device, and an insulation layer 65 is formed on the protection film 61, and then opening portions are formed in the insulation layer 65 and the protection film 61. Subsequently, a collector electrode 62B, a base electrode 63B and an emitter electrode 64B are formed by a conventional method (see FIG. 8C) to complete a bipolar transistor.

[Embodiment 5]

(First Semiconductor Device Manufacturing Method: Thin Film Transistor Manufacturing Method)

The embodiment 5 relates to a field effect type thin film transistor (TFT) manufacturing method in which the first heating method of the present invention is applied to crystallization of a polycrystal layer (polycrystal region) of polysilicon and activation of impurities-contained region (impurities-doped layer). Inert gas (Ar, for example) is used as the heating gas, and the first heating method of the present invention is performed. The TFT manufacturing method of the embodiment 5 will be described hereunder with reference to FIG. 9.

Figure 9A:
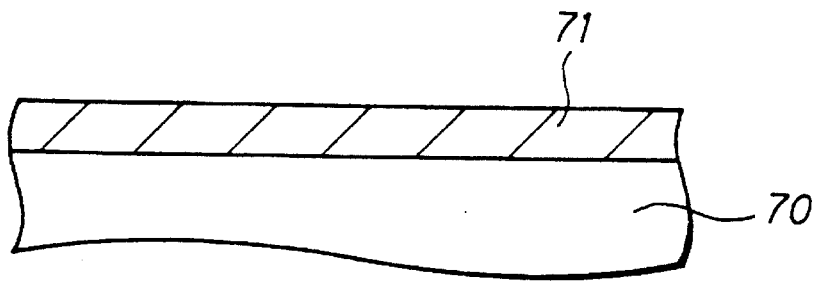
FIGS. 9A to 9E are partially cross-sectional views of a semiconductor substrate, etc. to explain a semiconductor device manufacturing method of a fifth embodiment of the present invention.
Figure 9B:
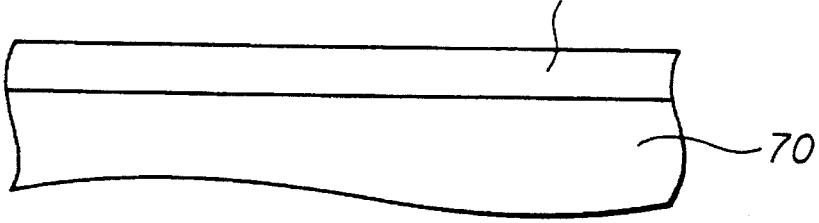
Figure 9C:
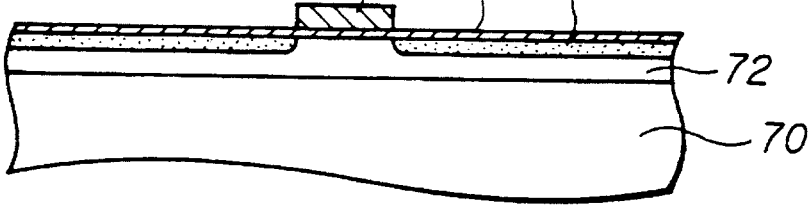
Figure 9D:
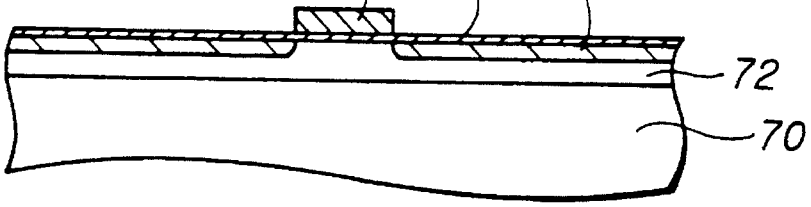
Figure 9E:
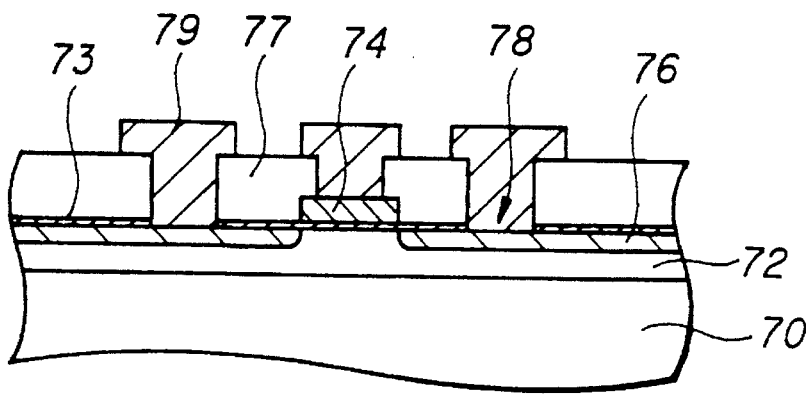

First, a polysilicon layer 71 is formed on an insulating substrate 70 of glass or the like by a CVD method, for example (see FIG. 9A).

Subsequently, the polysilicon layer 71 is crystallized by the first heating method of the present invention. In order to perform this crystallization, the substrate 70 (corresponding to the substrate, and thus the heat target 20) having the polysilicon layer 71 formed thereon is mounted in the heat-target holder in the heat chamber 10, and the gas is filled in the heat chamber 10. The following has been generally known. that is, it takes a remarkably long time (above 24 hours) to crystallize amorphous material at about 600° C., and thus the crystallization cannot be performed in a short time. However, if the temperature is increased to 1000° C. or more, the crystallization can be rapidly performed. Accordingly, the substrate 70 serving as the heat target is heated to 1000° C. or more by the heater 14, and then it is kept at 600° C.

Thereafter, the substrate 70 is directly heated using the heat generated in the first heating method of the present invention. That is, the piston 12 is rapidly displaced to the left in FIG. 1B. Through this process, the gas filled in the heating chamber 10 is compressed, and the semiconductor substrate 70 (heat target) is directly heated with the heat produced by the compressed gas. The heat condition is set so that the temperature of the semiconductor substrate 70 is increased to 1000° C. or more. Through this process, the substrate 70 is sufficiently heated, and the polysilicon layer 71 is crystallized to form a monocrystal silicon layer 72 (see FIG. 9B). The heating time is set in a millisecond order. The substrate 70 is uniformly heated, and thus the monocrystal silicon layer 72 can be uniformly formed.

Thereafter, the semiconductor substrate 70 is taken out from the heating device, and a gate oxide layer 73 is formed by a conventional method or the first heating method of the present invention, and then a gate electrode 74 is formed. Thereafter, desired impurities are doped into the monocrystal silicon layer 72 by the ion implantation method to form an impurities-contained region (impurities-doped layer) 75 (see FIG. 9C). Using the heating device shown in FIG. 1B, the activation of the impurities-contained region 75 is performed using the same heating method as the activation process for the impurities-contained region in the FET manufacturing method to form a source/drain region 76 (see FIG. 9D). The frequency of the gas compression process is not limited to once, and it may be suitably adjusted in accordance with the degree of activation. The heat activation can be optimized by executing the gas compression process at plural times.

Thereafter, the substrate 70 is taken out from the heating device, and an insulation layer 77 is formed on the source/drain region 76 and the gate electrode 74 which are formed on the substrate 70. Subsequently, opening portions 78 are formed in the insulation layer, and then metal wiring material 79 is buried in the opening portions 78 (see FIG. 9E) to complete a field effect type thin film transistor.

[Embodiment 6]

(Third Semiconductor Device Manufacturing Method: Field Effect Transistor Manufacturing Method)

In the embodiment 6, gas containing hydrogen is used, and a substrate (heat target) is heated by the first heating method of the present invention to suppress defects in the substrate. Gas containing halogen such as chlorine, fluorine or the like may be used.

That is, in the same manner as shown in FIG. 1B, a silicon semiconductor substrate (corresponding to the substrate, and thus the heat target 20) is mounted in the heat chamber 10, and the gas 30 containing hydrogen is filled in the heat chamber 10. Thereafter, the gas 30 is compressed to heat the silicon semiconductor substrate. With this process, the hydrogen diffuses into the silicon, and extinguishes doubling bonds. When the silicon semiconductor substrate (heat target) is heated for a long time, defects occur in the silicon semiconductor substrate again. Therefore, the first heating method of the present invention which is capable of performing a thermal treatment in an extremely short time is more effective to suppress the defects in the silicon semiconductor substrate. In this case, the silicon semiconductor substrate (heat target) may be pre-heated and then heated by compressing the gas.

[Embodiment 7]

(Fourth Semiconductor Device Manufacturing Method: Thin Film Transistor Manufacturing Method)

The embodiment 7 relates to a fourth semiconductor device manufacturing method in which a semiconductor device comprising an amorphous silicon thin film transistor is formed, and then the first heating method of the present invention is applied to the amorphous silicon thin film transistor thus formed (heat target) to improve the characteristics of the amorphous silicon thin film transistor. The amorphous silicon TFT has an excellent switching characteristic, and thus it has been widely used in various fields. However, the amorphous silicon has originally a small doping efficiency, and thus it is difficult to form a low-resistant silicon thin film. Therefore, it is difficult to establish ohmic contact between a metal electrode and a silicon thin film, and thus the characteristics of the amorphous silicon TFT are dispersed.

In the same manner as shown in FIG. 1B, the manufactured amorphous silicon thin film transistor (corresponding to the substrate, and thus the heat target 20) is mounted in the heat chamber 10, and the gas 30 of inert gas such as Ar or the like is filled in the heat chamber 10. Thereafter, the gas 30 is compressed to heat the amorphous silicon thin film transistor. With this process, the activation rate of a dope layer can be improved, and the excellent ohmic contact can be established. If the amorphous silicon thin film transistor (heat target) is heated for a long time, the characteristics of the amorphous silicon thin film would be fluctuated or deteriorated. Therefore, the heating method of the present invention in which the thermal treatment can be performed in an extremely short time can be more effectively used. In this case, it is also preferable that the amorphous silicon thin film transistor (heat target) is pre-heated and then the gas compression is conducted to heat the heat target.

[Embodiment 8]

The embodiment 8 relates to a third heating method in which solid, powdery or liquid material is used as the heat target, and the second heating method of the present invention is applied to the heat target to control vaporization of the heat target.

Figure 10:
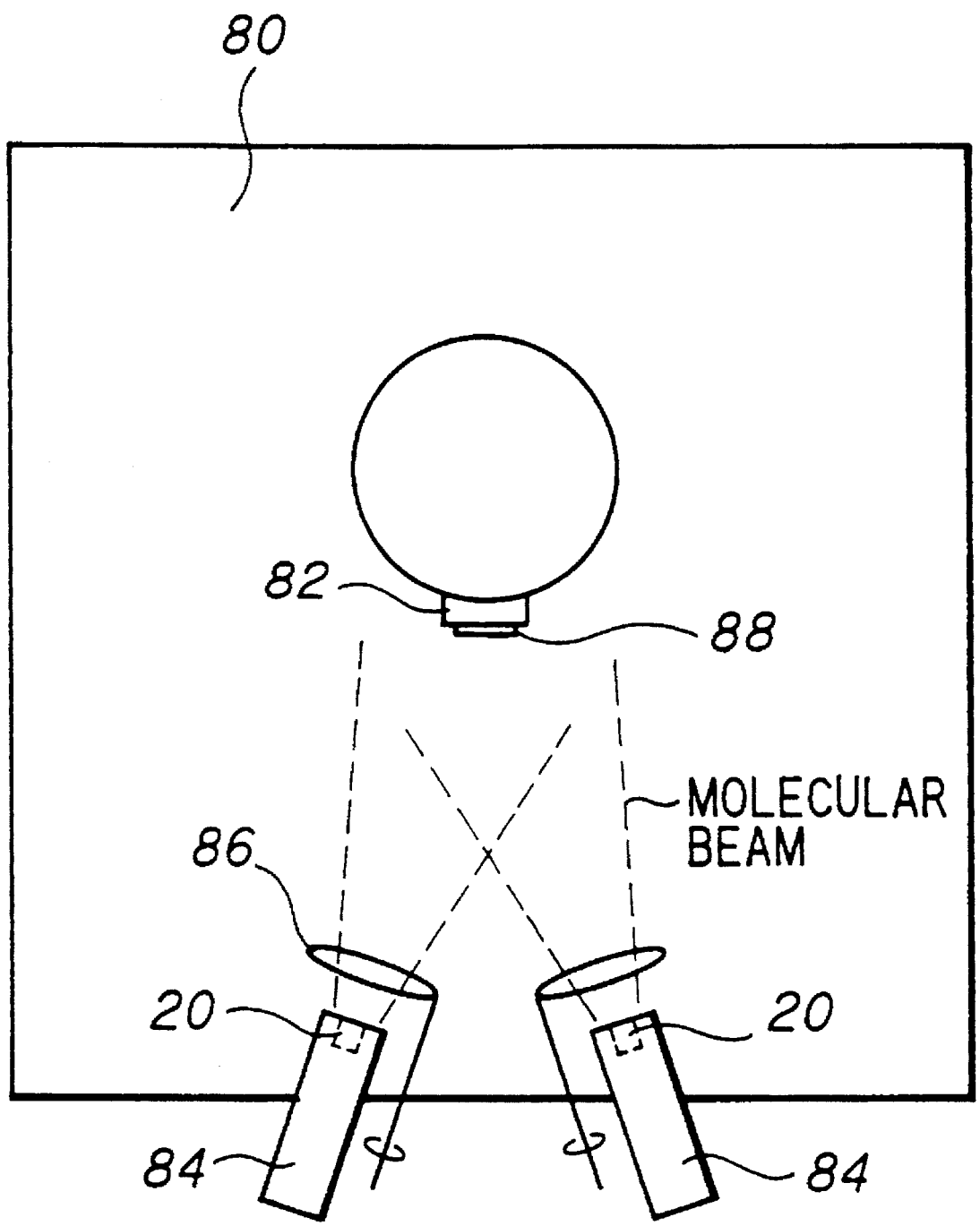
FIG. 10 is a diagram showing a molecular-beam epitaxial growth device.

Recently, it has been increasingly attempted to manufacture semiconductor devices, etc. by laminating extremely thin films with a molecular beam epitaxial growth (MBE) technique or the like. In this case, in order to control the thickness of the thin films accurately, it is required to precisely control the temperature of a vapor source serving as a source for thin film formation. As shown in FIG. 10, a molecular beam epitaxial growth device basically comprises an ultra-high-vacuum chamber 80, a substrate holder 82 having a heater (not shown), plural molecular beam source cells (for example, Knudsen cells) 84, and a shutter 86 disposed in front of the molecular source cells 84. Molecular beams are produced by heating the plural beam source cells 84 containing the molecular beam sources, and irradiated onto the substrate 88 which is held by the substrate holder 82. The irradiation of the molecular beams onto the substrate 88 is controlled by opening and closing the shutter 86. The vacuum degree of the ultra-high-vacuum chamber 80 is set to about $10^{-11}$ Torr, and the molecular beams are linearly divergent to only the aperture direction of each molecular source cell 84. Through this process, a thin film is formed on the substrate 88.

Figure 5A:
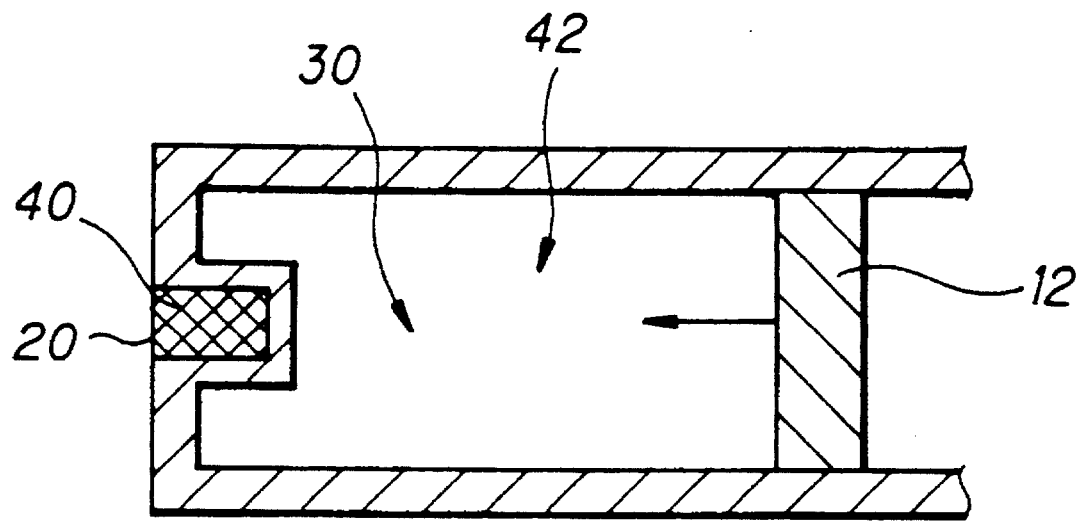
FIGS. 5A and 5B are schematic diagrams showing a heating device to which a second heating method of the present invention is applied.
Figure 5B:
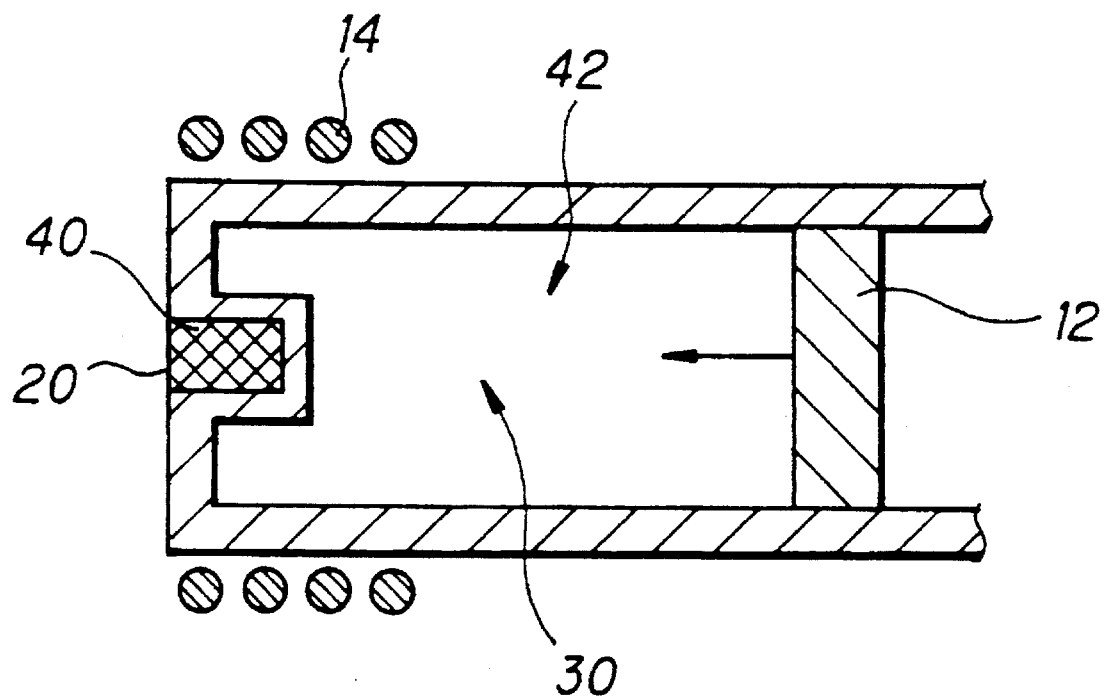

In the embodiment 8, the molecular source cells 84 are designed as shown in FIG. 5A. ZnSe, GaAs or SiGe is used as the heat target 20, and the second heating method of the present invention is applied. By the second heating method of the present invention, the molecular source cells 84 are intermittently heated for a short time to control vaporization (that is, a vapor pressure) accurately. With this process, a thin film can be accurately and easily formed at a desired thickness on the substrate 88. In this ease, the molecular beam source cells 84 may be pre-heated.

The present invention is not limited to the preferable embodiments as described above. In each embodiment, the heat device utilizes an adiabatic compression process. However, the heating device to which the heating method of the present invention is not limited to the heat devices shown in FIGS. 1, 4 and 5. Furthermore the shape and size of the heating device and the displacing mechanism for the piston may be Freely and suitably altered in design.

The various conditions as described in the above embodiments may be suitably altered. The heating temperature and the pre-heating temperature of the heat target may be suitably set in accordance with the heat target and the treating condition required for the heat target. The heat amount required for the activation of the impurities-contained region and the crystallization of the amorphous or polycrystal region is dependent on the number of doped impurity ions, a thermal conductivity of the substrate, etc., and thus the optimum condition for the first heating method of the present invention may be determined on the basis of various tests. For example, when ZnS is used as the heat target, ZnS starts its crystallization at about 300° C., and thus the pre-heat temperature and the heating temperature may be determined in consideration of the crystallization temperature.

Furthermore, the thermal treatment using the first heating method of the present invention is not limited to the heating process using only one gas compression process. That is, if the optimum result can be obtained by executing the heating process at plural times, the frequency of the heating process may be suitably determined. For example, if the optimum result can be obtained by performing a first heat process until the temperature increases to 1000° C. and then performing a second heat process until the temperature increases to 800° C., the gas compression condition and the pre-heat condition for the heat target may be suitably altered.

Still further, the heat target is not limited to silicon. For example, the heating method of the present invention is applicable to various kinds of heating processes for manufacturing a semiconductor device of polycrystal silicon, amorphous silicon, monocrystal silicon germanium, polycrystal silicon germanium or amorphous silicon germanium. Furthermore, the heating method of the present invention is applicable to various kinds of heating processes for manufacturing a semiconductor device of a compound semiconductor such as GaAs, ZnSe or the like.

The oxide film forming method using the first heating method of the present invention is not limited to a process for forming an oxide film on monocrystal silicon surface, and it may be applied to a process for forming an oxide film on polycrystal silicon or amorphous silicon surface. Furthermore, in the semiconductor device manufacturing process, a gate oxide film may be formed by using a lamination structure containing an oxide film formed by the present invention and an insulation film formed by another method. For example, the oxide film may be laminated with $SiO_2$, SiN or the like which is formed by a heat-decomposition CVD method, a plasma decomposition CVD method or a sputtering method. The oxidation treatment using the first heating method of the present invention is not limited to the heating process using only one gas compression process. That is, if the optimum result is obtained by performing the heating process at plural times, the frequency of the heating process may be executed at the optimum frequency.

In the embodiments as described above, the second heating method of the present invention is applied to the molecular beam epitaxial growth (MBE) technique, however, the second heating method of the present invention may be applied to a field which is required to accurately control the vaporization (vapor pressure) of the heat target.

In the embodiments as described above, the heating method of the present invention is applied to the semiconductor device manufacturing method, however, the heating method of the present invention may be applied to various fields such as a surface treatment for metal materials, plastic materials, fiber materials, etc., a surface treatment for a cutting instrument, etc., and other treatments.

According to the heat method of the present invention, the heat target can be uniformly heated to a high temperature in a short time by the gas compression. As a result, activation of a impurities-contained region, crystallization of a semiconductor film, formation of an oxide film and suppression of defects in gas can be performed over a large area uniformly and in a short time. In addition, the heat target can be rapidly cooled. Particularly, the heating method of the present invention can be expected to improve a device process epochally in an electronic device manufacturing process for a field effect transistor, a bipolar transistor, a thin film transistor, etc. The heating method of the present invention is effectively used to improve the characteristics of the amorphous silicon thin film transistor. Furthermore, the second heating method of the present invention is remarkably effectively used as a control method for vapor pressure of a vapor source.

What is claimed is:

1. A method for heating a substrate comprising:

placing a substrate to be heated in a closed heating chamber filled with a gas, said substrate and gas having a first temperature and said heating chamber having a first volume; and compressing the gas in said heating chamber by reducing the volume of said heating chamber to a second smaller volume, thereby heating said substrate and gas to a second higher temperature which is greater than the fist temperature by 400° C. or more.

2. A heating method wherein the step of performing activation of an impurities-containing region formed on the substrate or crystallization of an amorphous or polycrystal region formed on the substrate is performed by the heating method as defined in claim 1.

3. A semiconductor device manufacturing method using the heating method as defined in claim 1 comprising the step of:

forming an oxide film on said substrate using gas containing oxygen or gas containing oxygen and water.

4. A heating method using the heating method as defined in claim 1, comprising the step of:

suppressing defects in said substrate using gas containing hydrogen or halogen.

5. A semiconductor device manufacturing method using the heating method as defined in claim 1, comprising the steps of:

manufacturing a semiconductor device comprising an amorphous silicon thin film transistor; and then performing said heating method using the amorphous silicon thin film transistor as the substrate.

6. A method as defined in claim 1, wherein said second temperature is at least about 1000° C.

7. A method as defined in claim 1, wherein the chance in volume from said first volume to said second volume occurs in a compression time of about 10 milliseconds.

8. A method as defined in claim 1, wherein said substrate and gas are preheated to said first temperature.

9. A method as defined in claim 1, wherein said first temperature is about 600° C.

10. A method as defined in claim 1, wherein the ratio of the first volume/second volume defines a volume compression ratio of about 5.

11. A method as defined in claim 1, wherein said gas is selected from the group consisting of: argon, air, oxygen, nitrogen, hydrogen, halogen, water and mixtures of any of the foregoing.

12. A method for heating a substrate comprising the steps of:

filling gas in a heat chamber having a sidewall and having a piston capable of reducing or increasing volume of said heat chamber;

mounting a substrate having a first temperature to said sidewall outwardly adjacent to said heat chamber; and reducing the volume of said heat chamber by actuating the piston to produce heat, thereby heating said substrate to a second higher temperature which is greater than said first temperature by 400° C. or more.

13. A heating method using said heating method as claimed in claim 12, comprising the step of:

performing said heating method using solid, powdery or liquid material as the substrate to control vaporization of the substrate.

* * * * *